(12) United States Patent
Lee et al.

(10) Patent No.: US 10,861,448 B2
(45) Date of Patent: Dec. 8, 2020

(54) IN-VEHICLE VOICE RECOGNITION APPARATUS AND METHOD OF CONTROLLING THE SAME

(71) Applicants: HYUNDAI MOTOR COMPANY, Seoul (KR); KIA MOTORS CORPORATION, Seoul (KR)

(72) Inventors: Hye Joo Lee, Pucheon-si (KR); Sung Chan Park, Seoul (KR); Myoung Kyoung Ji, Yongin-si (KR); Jeong Suck Park, Yongin-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 104 days.

(21) Appl. No.: 16/213,716

(22) Filed: Dec. 7, 2018

(65) Prior Publication Data

US 2020/0098355 A1    Mar. 26, 2020

(30) Foreign Application Priority Data

Sep. 20, 2018 (KR) .................. 10-2018-0113128

(51) Int. Cl.
*G10L 15/00* (2013.01)
*G10L 15/20* (2006.01)
(Continued)

(52) U.S. Cl.
CPC .............. *G10L 15/20* (2013.01); *B60K 35/00* (2013.01); *G06F 3/167* (2013.01); *G10K 11/178* (2013.01);
(Continued)

(58) Field of Classification Search
CPC ................................ G10L 15/22; G10L 21/02
See application file for complete search history.

(56) References Cited

U.S. PATENT DOCUMENTS 6,665,645 B1 * 12/2003 Ibaraki .................... G10L 15/20
704/226
7,769,593 B2 * 8/2010 Venkataraman ........ G10L 15/20
381/110
(Continued)

FOREIGN PATENT DOCUMENTS

JP    2009-0109523 A    5/2009
JP    2009-0216835 A    9/2009
(Continued)

*Primary Examiner* — Daniel Abebe
(74) *Attorney, Agent, or Firm* — Morgan, Lewis & Bockius LLP

(57) ABSTRACT

An in-vehicle voice recognition apparatus capable of recognizing user voice more correctly by removing sound generated in a vehicle from sound input to a microphone, and a method of controlling the same are disclosed. The in-vehicle voice recognition apparatus according to an embodiment of the present disclosure includes a central processing unit configured to output a media signal, a digital signal processor configured to receive the media signal from the central processing unit and to convert the media signal into an analog signal, and an eco cancellation hardware connected to the digital signal processor and configured to receive the analog signal, to acquire a first final media output on the basis of the analog signal and to acquire a voice command from a sound input through a microphone on the basis of the first final media output.

17 Claims, 7 Drawing Sheets

(51) Int. Cl.
  *G10L 15/22* (2006.01)
  *B60K 35/00* (2006.01)
  *G10K 11/178* (2006.01)
  *H04R 3/02* (2006.01)
  *G06F 3/16* (2006.01)

(52) U.S. Cl.
  CPC ............... *G10L 15/22* (2013.01); *H04R 3/02* (2013.01); *B60K 2370/148* (2019.05); *G10K 2210/1282* (2013.01); *G10L 2015/223* (2013.01)

(56) References Cited

U.S. PATENT DOCUMENTS

| | | |
|---|---|---|
| 9,628,141 B2 | 4/2017 | Wyss et al. |
| 9,704,478 B1 | 7/2017 | Vitaladevuni et al. |
| 2005/0159945 A1* | 7/2005 | Otsuka .................... G10L 15/20 704/226 |
| 2006/0126866 A1* | 6/2006 | Falcon ..................... H04S 7/00 381/104 |
| 2009/0024662 A1* | 1/2009 | Park ....................... G11B 20/10 |
| 2016/0012813 A1* | 1/2016 | Every .................... G10L 21/02 381/66 |
| 2017/0061980 A1 | 3/2017 | Jang et al. |

FOREIGN PATENT DOCUMENTS

| | | |
|---|---|---|
| JP | 2017-0138536 A | 8/2017 |
| KR | 10-2017-0138429 A | 12/2017 |

\* cited by examiner

IN-VEHICLE VOICE RECOGNITION APPARATUS AND METHOD OF CONTROLLING THE SAME

This application claims the benefit of priority to Korean Patent Application No. 10-2018-0113128, filed on Sep. 20, 2018 with the Korean Intellectual Property Office, which is hereby incorporated by reference as if fully set forth herein.

TECHNICAL FIELD

The present disclosure relates to an in-vehicle voice recognition apparatus and, more specifically, a voice recognition apparatus capable of recognizing user voice more correctly by removing sound generated in a vehicle from sound input to a microphone, and a method of controlling the same.

BACKGROUND

Recent vehicles employ a voice recognition function more actively. However, vehicle environments are constantly exposed to noise caused by reproduction of multimedia content in vehicles as well as surrounding noise. Accordingly, there have been efforts to increase a voice recognition rate in vehicles.

For example, two or more microphones may be used, as shown in FIG. 1. FIG. 1 is a view illustrating a vehicle configuration employing a dual microphone.

Referring to FIG. 1, a microphone 111 close to a driver's seat and a microphone 112 close to a front passenger seat are disposed in a cabin. The microphones may cover different areas 121 and 122 by having directivity according to beamforming. In such a case, an improved voice recognition rate compared to cases in which a single microphone is used can be expected even in bad conditions, and the same voice recognition rate as that at the driver's seat can be achieved at the front passenger seat.

In addition to a method of increasing the number of hardware devices, use of methods of removing noise input through a microphone is considered. A typical example of such methods is eco cancellation. Echo cancellation refers to a method of extracting voice input to a microphone by eliminating howling caused by sound input to the microphone and sound output from a speaker through an amplifier. This will be described in more detail with reference to FIG. 2.

FIG. 2 illustrates an example of a vehicle structure in which general eco cancellation is implemented.

Referring to FIG. 2, a vehicle may include a head unit 210, a radio tuner 220, an external amplifier 230, a speaker 240 and a microphone 250. Here, the head unit may include a central processing unit (CPU) 211, a digital signal processor (DSP) 212, and echo cancellation (E/C) hardware 213. The DSP 212 processes an audio signal input from the CPU 211 or the radio tuner 220 into an analog signal and sends the analog signal to the external amplifier 230.

The external amplifier 230 applies an equalizer (EQ) 231 to the analog signal, amplifies the analog signal through an amplifier 232 and then transfers a final media signal to the speaker 240. The function of the equalizer 231 is described with reference to FIG. 3. FIG. 3 is a view for illustrating a general equalizer function.

Referring to FIG. 3, the equalizer 231 has a plurality of predetermined equalizer logics, for example, F(X), G(X) and (HX). Here, when the CPU 211 notifies the equalizer 231 of an equalizer logic to be used, the equalizer 231 processes an analog signal input from the DSP 212 according to the notified equalizer logic. For example, if the CPU 211 instructs the equalizer 231 to apply F(X) logic to an input analog signal a, the equalizer 231 outputs a signal corresponding to F(a).

Referring back to FIG. 2, if a driver utters a voice command in a state in which sound is output from the speaker, the voice command and the sound output from the speaker are input together to the microphone 250.

In this case, a voice command recognition rate may deteriorate due to the sound input along with the voice command if the eco cancellation function is not applied. To apply the eco cancellation function, a final media signal output from the external amplifier 230 needs to arrive at the E/C hardware 213 before a final media signal output through the speaker is input to the microphone because the E/C hardware 213 needs to know an audio signal to be canceled in advance.

However, it is difficult for a final media signal to arrive at the E/C hardware 213 prior to input of sound corresponding to a final media signal output through the speaker 240 through the microphone 250 in a general video structure. This will be described with reference to FIG. 4.

FIG. 4 illustrates an example of audio hardware arrangement in a general vehicle.

Referring to FIG. 4, when audio hardware is arranged in a vehicle, the head unit 210 and the microphone 250 are disposed in a front seat, the external amplifier 230 is disposed in a back seat, and the speaker is disposed on the left and right in a front seat and a back seat in a form of surrounding the cabin, in general. Accordingly, the head unit 210 and the external amplifier 230 have a considerable physical distance therebetween and the distance between the microphone 250 and the speaker is much longer than the distance between the head unit and the external amplifier. As a result, it is difficult for a final media signal to arrive at the E/C hardware prior to input of sound corresponding to a final media signal output through the speaker 240 to the microphone 250 due to a physical distance difference.

Although such a physical distance problem can be solved if the external amplifier 230 is embedded in the head unit 210, it is practically different to embed the amplifier in the head unit 210 because various electronic apparatuses and air-conditioning equipment are mounted near a center fascia in general. Accordingly, a method for guaranteeing effective execution of the eco cancellation function even in a structure in which an external amplifier is applied is required.

SUMMARY

Accordingly, the present disclosure is directed to an in-vehicle voice recognition apparatus capable of improving a voice recognition rate.

Particularly, an object of the present disclosure is to provide an in-vehicle voice recognition apparatus for allowing eco cancellation hardware to acquire a final media output prior to a microphone.

It will be appreciated by persons skilled in the art that the objects that could be achieved with the present disclosure are not limited to what has been particularly described hereinabove and the above and other objects that the present disclosure could achieve will be more clearly understood from the following detailed description.

To achieve the objects and other advantages and in accordance with the purpose of the invention, as embodied and broadly described herein, the present disclosure provides an in-vehicle voice recognition apparatus according to an embodiment of the present disclosure may include: a central processing unit configured to output a media signal; a digital signal processor configured to receive the media signal from the central processing unit and to convert the media signal into an analog signal; and eco cancellation hardware connected to the digital signal processor and configured to receive the analog signal, to acquire a first final media output on the basis of the analog signal and to acquire a voice command from sound input through a microphone on the basis of the first final media output.

In addition, a method of controlling an in-vehicle voice recognition apparatus according to an embodiment of the present disclosure may include: a digital signal processor receiving a media signal from a central processing unit and converting the media signal into an analog signal; eco cancellation hardware receiving the analog signal from the digital signal processor; the eco cancellation hardware acquiring a first final media output on the basis of the analog signal; and the eco cancellation hardware acquiring a voice command from sound input through a microphone on the basis of the first final media output.

The in-vehicle voice recognition apparatus according to at least one embodiment of the present disclosure, configured as described above, can expect an improved voice recognition rate.

Particularly, the eco cancellation hardware can acquire a final media signal prior to the microphone by directly applying a suitable equalizer logic because an analog signal input to the external amplifier is directly input to the eco cancellation hardware.

It will be appreciated by persons skilled in the art that the effects that can be achieved with the present disclosure are not limited to what has been particularly described hereinabove and other advantages of the present disclosure will be more clearly understood from the following detailed description.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
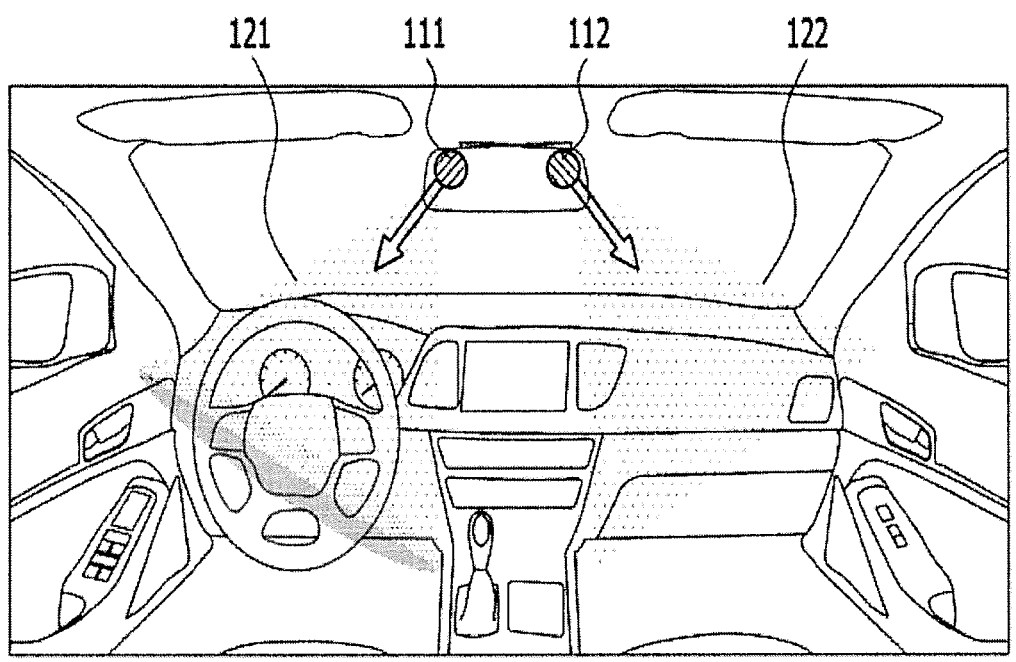
FIG. 1 is a view illustrating a vehicle configuration employing a dual microphone.

Reference will now be made in detail to the preferred embodiments of the present disclosure, examples of which are illustrated in the accompanying drawings. The suffixes "module" and "unit" of elements herein are used for convenience of description and thus can be used interchangeably and do not have any distinguishable meanings or functions.

Embodiments of the present disclosure will be described in detail with reference to the accompanying drawings so that the present disclosure can be easily realized by those skilled in the art. However, the present disclosure can be realized in various different forms and is not limited to the embodiments described herein. Parts that are not related to description will be omitted for clear description in the drawings, and the same reference numbers will be used throughout this specification to refer to the same or like parts.

Throughout the specification, the term "includes" should be interpreted not to exclude other elements but to further include such other elements since the corresponding elements may be included unless mentioned otherwise. Further, the same reference numbers will be used throughout this specification to refer to the same or like parts.

In an embodiment of the present disclosure, an analog signal input to an external amplifier is directly input to eco cancellation hardware and the eco cancellation hardware acquires a final media signal prior to a microphone by directly applying a suitable equalizer logic. To this end, it is desirable that the eco cancellation hardware acquire information for applying a suitable equalizer logic from a central processing unit.

An equalizer logic may refer to a processing function per band for correcting frequency characteristics to adjust a tone in the following embodiments but is not limited thereto and may be referred to as "equalizer setting".

Figure 5:
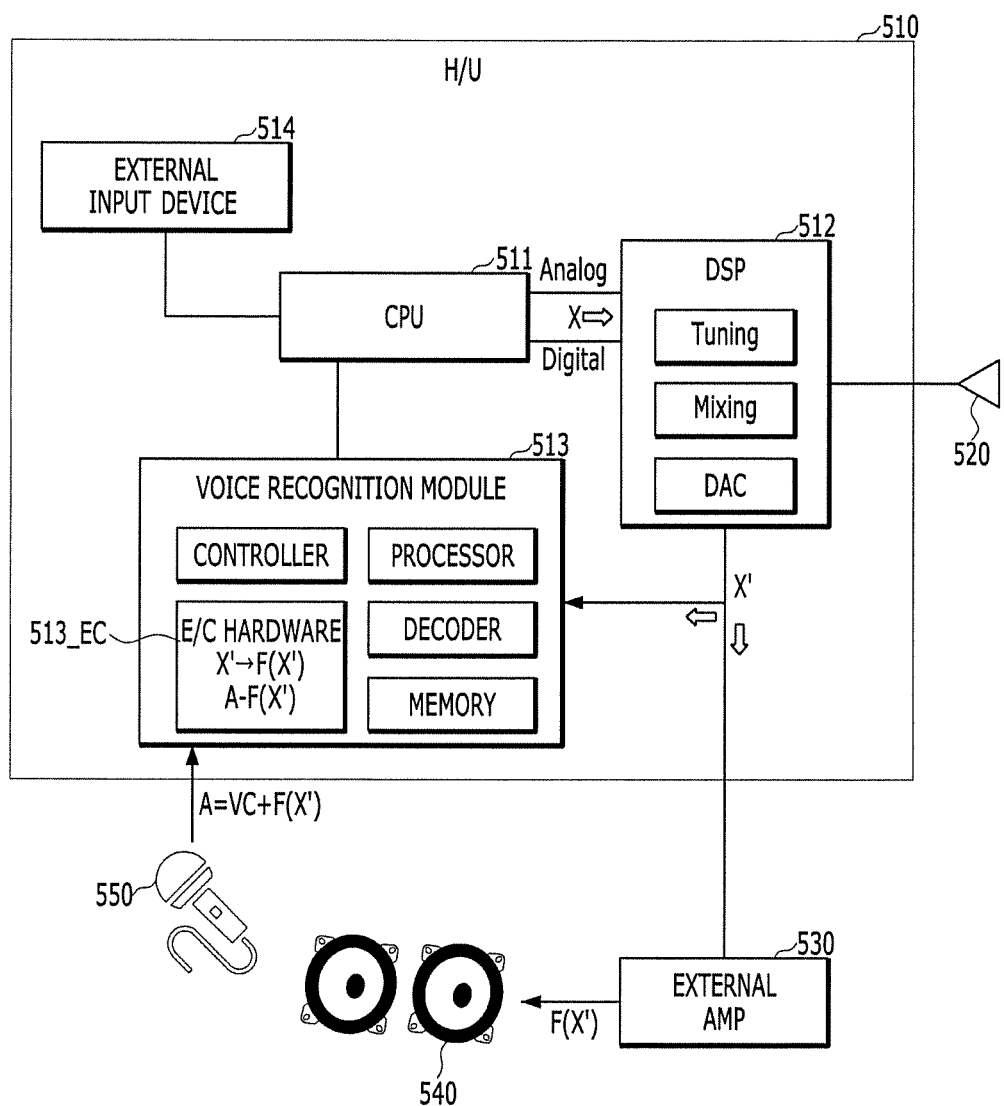
FIG. 5 illustrates an example of a vehicle configuration including an in-vehicle voice recognition apparatus to which embodiments of the present disclosure are applicable.

First, a configuration of an in-vehicle voice recognition apparatus to which embodiments of the present disclosure are applicable will be described with reference to FIG. 5. FIG. 5 illustrates an example of a vehicle configuration including the in-vehicle voice recognition apparatus to which embodiments of the present disclosure are applicable.

Referring to FIG. 5, a vehicle may include a head unit 510, a radio tuner 520, an external amplifier 530, a speaker 540 and a microphone 550. Here, the head unit may include a CPU 511, a digital signal processor (DSP) 512, a voice recognition module 513 including eco cancellation (E/C) hardware 513_EC, and an external input device 514.

The DSP 512 and the voice recognition module 513 each may be a hardware device and may be an electric circuitry that executes instructions of software which thereby performs various functions described hereinafter. The voice recognition module 513 may further include a controller, a processor, a decoder, and a memory.

The CPU 511 may manage media modes according to user operations and transfer audio data input through the external input device 514 to the DSP 512 through two analog and digital channels. For example, audio data transferred in a digital manner may be AV sound, Bluetooth streaming sound, Android auto-sound, CarPlay sound and the like acquired through the external input device 514 and audio data transferred in an analog manner may be navigation guidance sound and the like, without being limited thereto.

Figure 2:
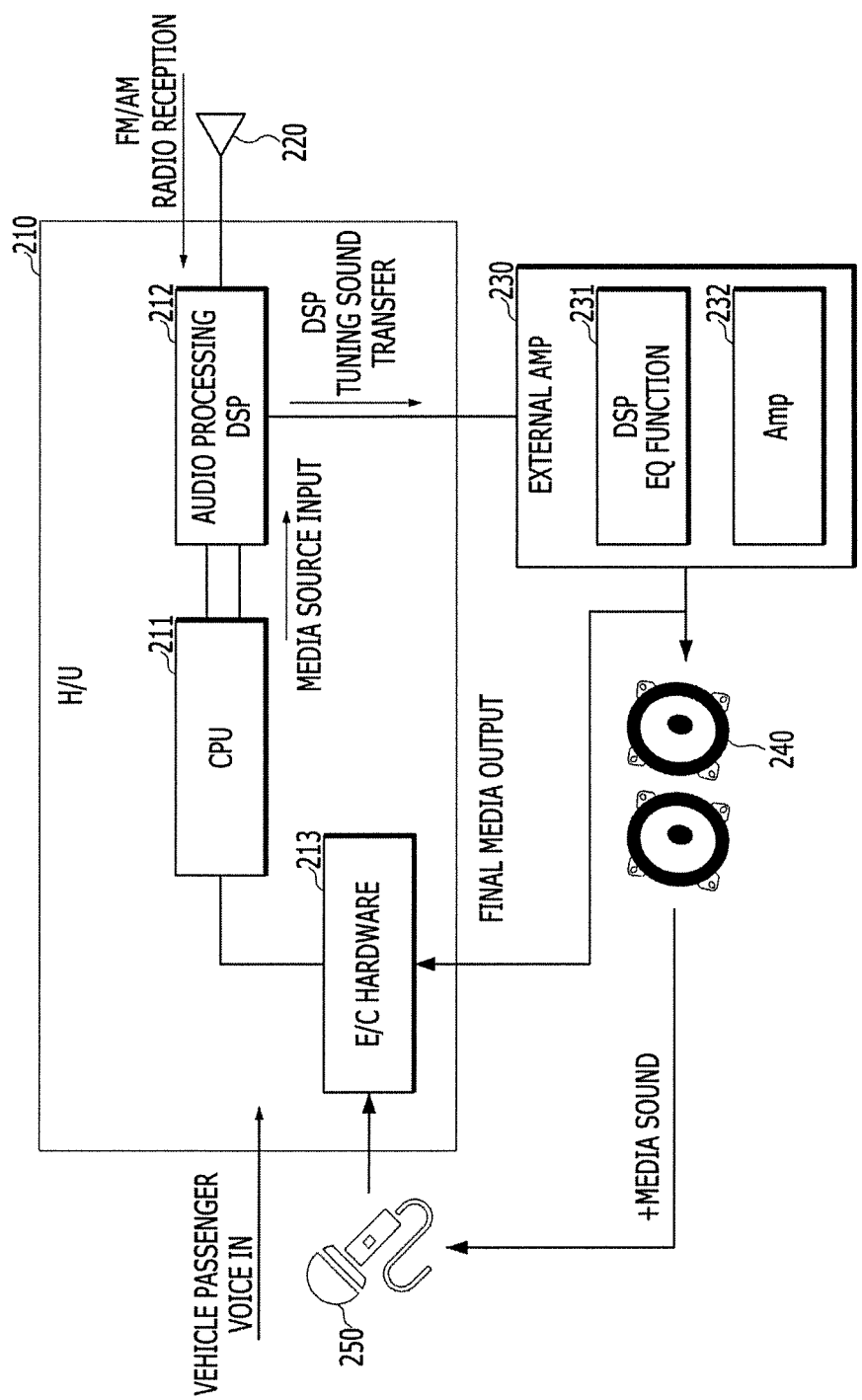
FIG. 2 is a view illustrating an example of a vehicle structure in which general eco cancellation is implemented.
Figure 3:
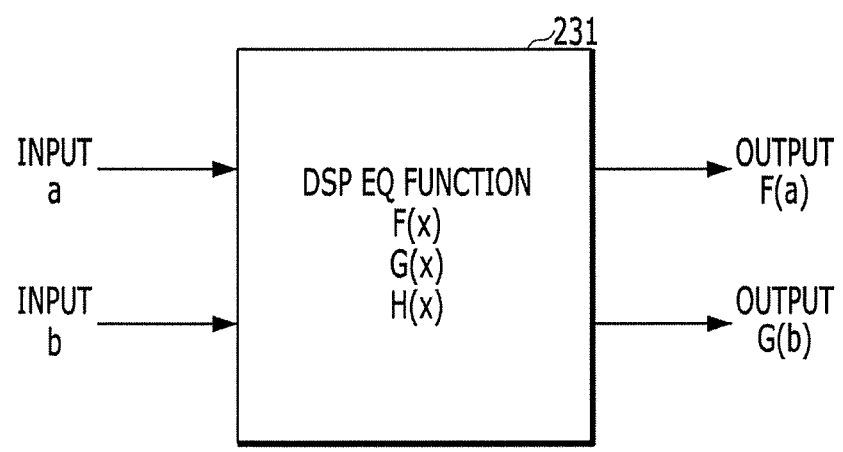
FIG. 3 is a view illustrating a general equalizer function.
Figure 4:
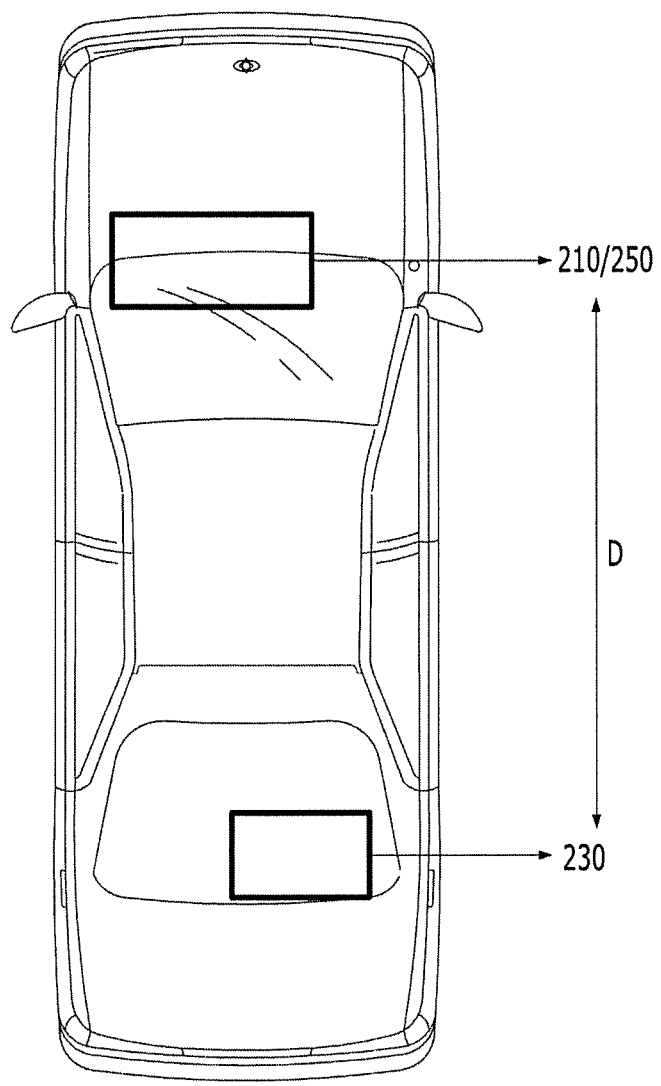
FIG. 4 illustrates an example of audio hardware arrangement in a general vehicle.

The DSP 512 tunes in/mixes audio data X received from the CPU 511 or received through the radio tuner 520, converts the audio data into an analog signal X' through a digital-to-analog converter DAC and transfers the analog signal X' to the external amplifier 530. Here, hard wiring is provided between the DSP 520 and the voice recognition module 513 distinguished from the configuration shown in FIG. 2. Accordingly, the analog signal X' output from the DSP 520 is also transferred to the voice recognition module 513 in addition to the external amplifier 530.

An equalizer logic corresponding to a current media mode is applied to the analog signal X' output from the DSP 520 to convert the analog signal X' into a final media signal F(X') in the external amplifier 530 and the final media signal F(X') is output to the speaker 540. In addition, the equalizer logic corresponding to the current media mode is also applied to the analog signal X' to convert the analog signal X' into the final media signal F(X') in the E/C hardware 513_EC of the voice recognition module 513. To this end, the CPU 511 may notify the external amplifier 530 and the E/C hardware 513_EC of a signal corresponding to the current media mode.

Consequently, the E/C hardware 513_EC can acquire the same signal as the final media output signal F(X') more rapidly compared to a method of receiving a final media output signal from the external amplifier 530 irrespective of a physical distance to the external amplifier 530 by performing an equalization process on the analog signal X' in the same manner in which the external amplifier 530 processes the analog signal X' although it does not directly receive the final media output signal F(X').

As the E/C hardware 513_EC acquires the final media output signal F(X') in advance, the E/C hardware 513_EC can effectively separate a voice command VC of a user from sound A input through the microphone 550 even if the sound A input through the microphone 550 includes the final media output signal F(X') and the voice command VC of the user.

Accordingly, the voice recognition module 513 can perform pre-processing on the separated voice command VC and compare the pre-processed voice command with values stored in the memory to determine the type of the command. Here, command types may include a wake command and a direct command. The wake command may refer to a command for voice recognition function initiation and the direct command may refer to a command belonging to a command pool which is executable immediately after command recognition even in modes other than a voice recognition mode. Particularly, the eco cancellation function is more important for the wake command because the wake command needs to be recognized all the time even in bad conditions.

Figure 6:
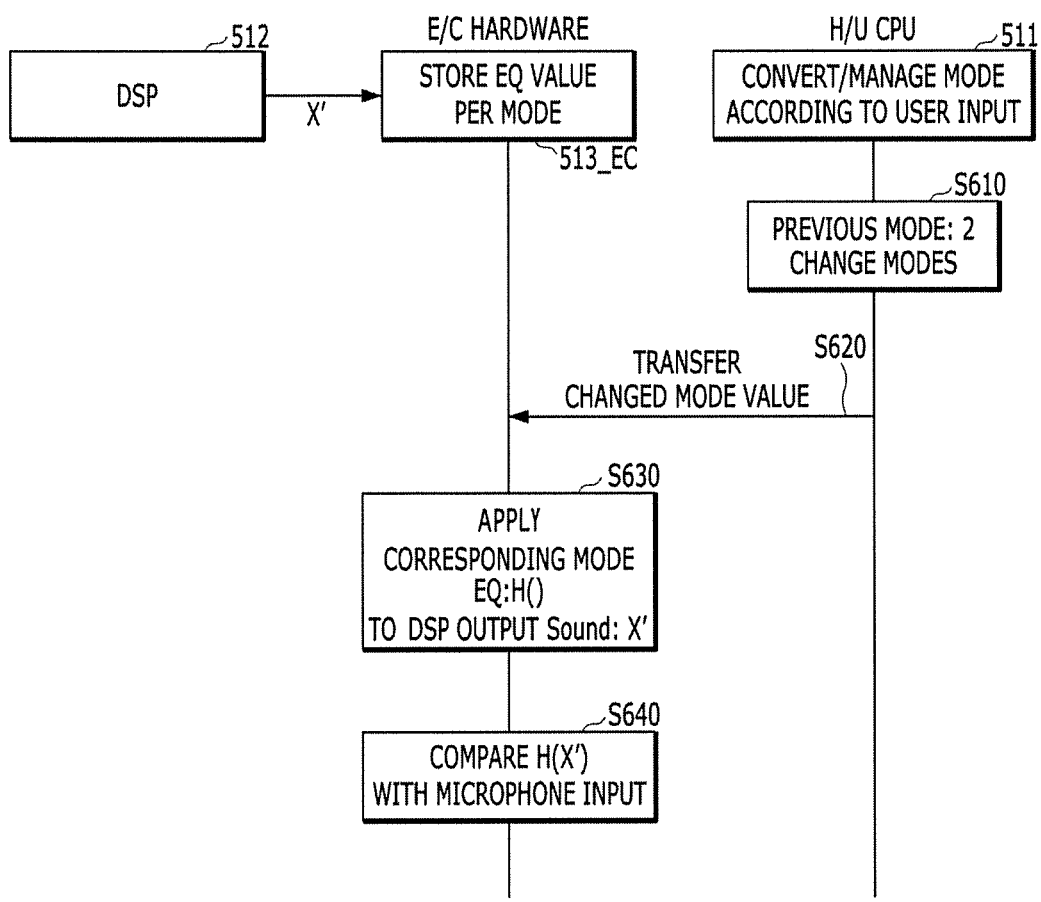
FIG. 6 illustrates an example of a process of determining an equalizer logic corresponding to a current mode in a voice recognition apparatus according to an embodiment of the present disclosure.

Hereinafter, a method of determining an equalizer logic corresponding to a current mode in the E/C hardware will be described with reference to FIG. 6. FIG. 6 illustrates an example of a process of determining an equalizer logic corresponding to a current mode in a voice recognition apparatus according to an embodiment of the present disclosure.

In FIG. 6, the following conditions are assumed.

The E/C hardware 513_EC according to the present embodiment may include a mapping table in which equalizer logics are defined for respective modes. Since vehicle models have different optimum equalizer logics according to concepts, brands or sizes thereof, equalizer logics stored in the E/C hardware 513_EC are values optimized for spatial characteristics of vehicles and tuned for respective vehicle models. Equalizer logics may have different characteristics but are not limited thereto. Such equalizer logics are applied for respective modes for the reason below.

Regarding navigation guidance voice, most sound sources are within a range of 200 Hz to 5 kHz as characteristics of human voice. Regarding music, rock music (1 kHz to 20 kHz) and classical music (500 Hz to 20 kHz) use frequencies different from guidance voice. Further, in the case of radio which is a combination of guidance voice and music, an EQ value different from music and navigation guidance voice is applied. In this manner, optimum EQ values are tuned and provided for respective media modes.

Accordingly, an equalizer logic corresponding to a real-time media mode notified by the CPU 511 can be applied. Here, it is desirable that the mapping table included in the E/C hardware and equalizer logics defined therein be the same as a mapping table included in the external amplifier and equalizer logics defined therein.

For example, a mapping table of the CPU and the mapping table of the E/C hardware may have forms as shown in Tables 1 and 2.

TABLE 1

| Mode | Value |
|------|-------|
| FM | 1 |
| AM | 2 |
| Music | 3 |
| BT | 4 |

TABLE 2

| Value | EQ logic |
|-------|----------|
| 1 | F( ) |
| 2 | G( ) |
| 3 | H( ) |
| 4 | I( ) |

Referring to FIG. 6, the CPU 511 of the head unit 510 constantly manages media modes. If a previous mode (for example, "AM" in Table 1) corresponding to a mode value 2 is changed to a mode value 3 (for example, "music" in Table 1) according to a button operation of a user (S610), the CPU 511 notifies the E/C hardware 513_EC of the changed mode value (i.e., 3) (S620).

Accordingly, the E/C hardware 513_EC checks an equalizer logic (for example, H( ) in Table 2) corresponding to a changed mode identifier and applies the equalizer logic to the analog signal X' received from the DSP 512 (S630).

Since the external amplifier 530 also applies the logic H( ) to the analog signal X', the E/C hardware 513_EC can acquire the same media output H(X') as the final media output of the external amplifier 530 in advance and compare the media output H(X') with microphone input to separate a voice command (S640).

According to another embodiment of the present disclosure, the aforementioned eco cancellation function may be applied to customized equalizer logics. This will be described with reference to FIG. 7.

Figure 7:
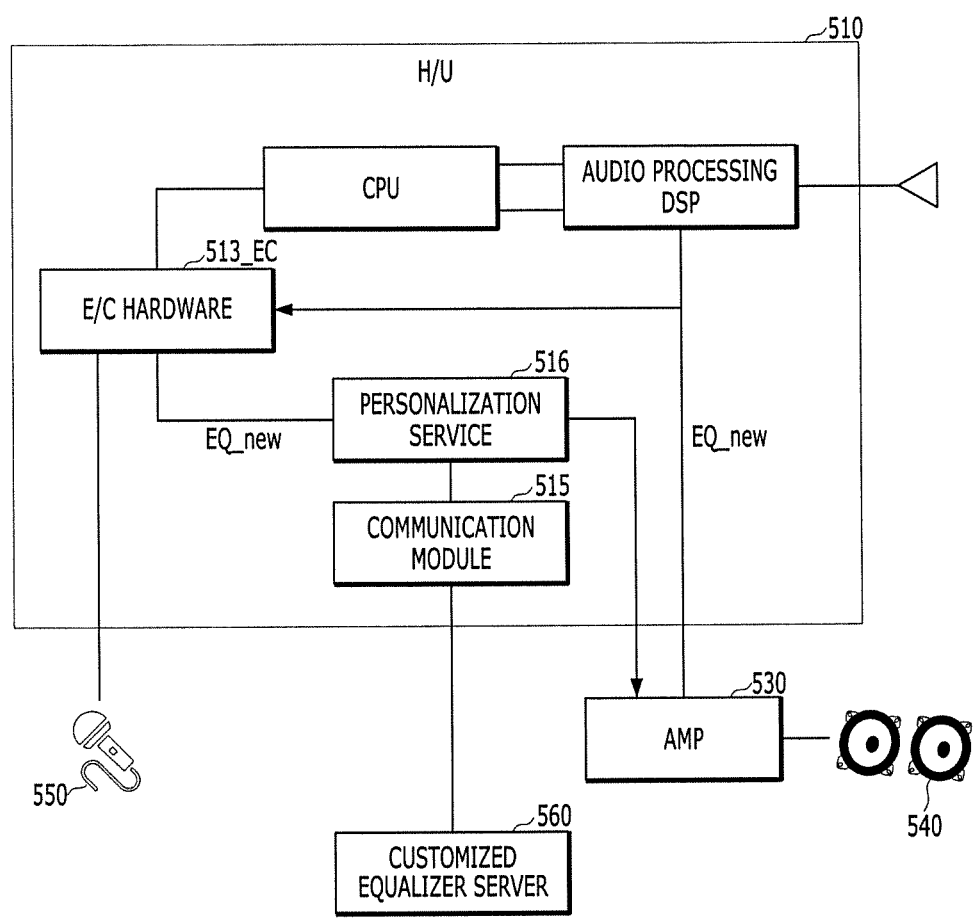
FIG. 7 illustrates an example of a configuration of an in-vehicle voice recognition apparatus according to another embodiment of the present disclosure.

FIG. 7 illustrates an example of a configuration of an in-vehicle voice recognition apparatus according to another embodiment of the present disclosure.

The configuration shown in FIG. 7 is substantially the same as the configuration of FIG. 5 except that a communication module 515 and a personalization service module 516 are added to the head unit 510, and thus description will focus on a difference therebetween.

The communication module 515 and the personalization service module 516 each may be a hardware device implemented with various electronic circuits to transmit and receive signals via wireless or landline connections.

Referring to FIG. 7, the communication module 515 may download a customized equalizer logic different from equalizer logics stored in a vehicle during manufacture of the vehicle from a server 560 through wired or wireless access.

The downloaded customized equalizer logic may be stored in an arbitrary or preset storage space in the head unit 510 and may be transmitted to the E/C hardware 513_EC and the external amplifier 530 through the personalization service module 516. If a user selects the customized equalizer logic, the E/C hardware 513_EC and the external amplifier 530 can apply the customized equalizer logic to an analog output of the DSP. The eco cancellation operation thereafter has been described.

Such a customized equalizer logic is applicable to engine sound tuning as well as general media output.

The above-described embodiments of the present disclosure have the following effects.

It is possible to improve a recognition rate for the wake command which is essential for voice recognition function. Particularly, while the wake command needs to constantly operate even in bad conditions, eco cancellation can be performed on the wake command in real time by acquiring media sound which is a comparison group in advance. Accordingly, voice recognition can be performed using the external amplifier without regard to the physical distance between the external amplifier and the head unit.

In actual vehicle implementation, improved voice recognition can be achieved simply by adding hardware wiring between the E/C hardware and the DSP and adding an equalizer application logic and a selection logic according to modes to the E/C hardware, requiring little additional expenses.

The present disclosure may be implemented as code readable by a computer and stored in a computer-readable recording medium. The computer-readable recording medium includes all kinds of recording devices in which data readable by computer systems is stored. Examples of the computer-readable recording medium include an HDD (Hard Disk Drive), an SSD (Solid State Drive), an SDD (Silicon Disk Drive), a ROM, a RAM, a CD-ROM, a magnetic tape, a floppy disk, an optical data storage device, and the like.

Accordingly, the above description needs to be construed in all aspects as illustrative and not restrictive. The scope of the present disclosure should be determined by the appended claims and their legal equivalents, not by the above description, and all changes coming within the meaning and equivalency range of the appended claims are intended to be embraced therein.

What is claimed is:

1. An in-vehicle voice recognition apparatus comprising:
a central processing unit configured to output a media signal;
a digital signal processor configured to receive the media signal from the central processing unit and convert the media signal into an analog signal; and
an eco cancellation hardware connected to the digital signal processor and configured to receive the analog signal, and configured to acquire a first final media output on the basis of the analog signal and acquire a voice command from a sound input through a microphone on the basis of the first final media output,
wherein the eco cancellation hardware includes a plurality of equalizer settings corresponding to a plurality of modes and, upon reception of a mode value from the central processing unit, applies an equalizer setting corresponding to the mode value among the plurality of equalizer settings to the analog signal to acquire the first final media output.

2. The in-vehicle voice recognition apparatus according to claim 1, wherein the eco cancellation hardware determines the equalizer setting corresponding to the mode value with reference to a table in which a corresponding relationship between mode values corresponding to the plurality of modes and the plurality of equalizer settings is defined.

3. The in-vehicle voice recognition apparatus according to claim 1, further comprising an external amplifier connected to the digital signal processor and configured to receive the analog signal, apply an equalizer setting corresponding to a current mode to the analog signal to acquire a second final media output, and amplify the second final media output and transfer the amplified second final media output to a speaker.

4. The in-vehicle voice recognition apparatus according to claim 3, wherein the first final media output corresponds to the second final media output.

5. The in-vehicle voice recognition apparatus according to claim 3, wherein the sound input through the microphone includes at least sound obtained when the second final media output is output through the speaker.

6. The in-vehicle voice recognition apparatus according to claim 1, wherein the central processing unit performs mode management according to an input of a user command.

7. The in-vehicle voice recognition apparatus according to claim 3, further comprising:
a communication module configured to receive a customized equalizer setting from an external server; and
a personalization service module configured to transmit the received customized equalizer setting to the eco cancellation hardware and the external amplifier.

8. The in-vehicle voice recognition apparatus according to claim 1, wherein the voice command includes a wakeup command and a direct command.

9. A vehicle including the in-vehicle voice recognition apparatus according to claim 1.

10. A method of controlling an in-vehicle voice recognition apparatus, comprising:
receiving, by a digital signal processor, a media signal from a central processing unit and converting the media signal into an analog signal;
receiving, by an eco cancellation hardware, the analog signal converted by the digital signal processor;
acquiring, by the eco cancellation hardware, a first final media output on the basis of the analog signal; and
acquiring, by the eco cancellation hardware, a voice command from a sound input through a microphone on the basis of the first final media output,
wherein the eco cancellation hardware includes a plurality of equalizer settings corresponding to a plurality of modes, and
wherein the acquiring of the final media output comprises:
receiving, by the eco cancellation hardware, a mode value from the central processing unit; and
applying, by the eco cancellation hardware, an equalizer setting corresponding to the mode value among the plurality of equalizer settings to the analog signal to acquire the first final media output.

11. The method according to claim 10, wherein the applying of the equalizer setting comprises determining, by the eco cancellation hardware, the equalizer setting corresponding to the mode value with reference to a table in which a corresponding relationship between mode values corresponding to the plurality of modes and the plurality of equalizer settings is defined.

12. The method according to claim 10, further comprising:
receiving, by an external amplifier, the analog signal from the digital signal processor;

applying, by the external amplifier, an equalizer setting corresponding to a current mode to the analog signal to acquire a second final media output; and amplifying, by the external amplifier, the second final media output and transferring the amplified second final media output to a speaker.

13. The method according to claim 12, wherein the first final media output corresponds to the second final media output.

14. The method according to claim 12, wherein the sound input through the microphone includes at least sound obtained when the second final media output is output through the speaker.

15. The method according to claim 10, wherein the central processing unit performs mode management according to an input of a user command.

16. The method according to claim 12, further comprising:

receiving, by a communication module, a customized equalizer setting from an external server; and transmitting, by a personalization service module, the received customized equalizer setting to the eco cancellation hardware and the external amplifier.

17. The method according to claim 10, wherein the voice command includes a wake command and a direct command.

* * * * *